United States Patent
Kohli

(10) Patent No.: US 8,929,115 B2
(45) Date of Patent: Jan. 6, 2015

(54) XY TERNARY CONTENT ADDRESSABLE MEMORY (TCAM) CELL AND ARRAY

(75) Inventor: Nishu Kohli, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 457 days.

(21) Appl. No.: 13/307,167

(22) Filed: Nov. 30, 2011

(65) Prior Publication Data
US 2013/0135914 A1 May 30, 2013

(51) Int. Cl.
| | | |
|---|---|---|
| G11C 15/00 | (2006.01) | |
| G11C 15/04 | (2006.01) | |
| G11C 11/412 | (2006.01) | |
| H01L 27/11 | (2006.01) | |
| G11C 5/02 | (2006.01) | |
| G11C 5/06 | (2006.01) | |
| H01L 27/00 | (2006.01) | |
| H01L 27/02 | (2006.01) | |

(52) U.S. Cl.
CPC ............ *G11C 15/04* (2013.01); *H01L 27/1104* (2013.01); *G11C 15/00* (2013.01); *H01L 27/00* (2013.01); *H01L 27/0207* (2013.01); *G11C 11/412* (2013.01); *H01L 27/11* (2013.01); *G11C 5/02* (2013.01); *G11C 5/063* (2013.01); *G11C 5/06* (2013.01); *G11C 5/025* (2013.01)
USPC .................... 365/49.1; 365/49.11; 365/49.15; 365/49.16; 365/49.17; 365/63; 365/72; 257/E21.661; 257/E27.098; 257/E27.099

(58) Field of Classification Search
CPC ...... G11C 11/412; G11C 15/00; G11C 15/04; G11C 5/02; G11C 5/025; G11C 5/06; G11C 5/063; H01L 27/0207; H01L 27/11; H01L 27/1104
USPC ............ 365/49.1, 49.11, 49.15, 49.16, 49.17, 365/63, 72; 257/E21.661, E27.098, 257/E27.099
See application file for complete search history.

(56) References Cited

U.S. PATENT DOCUMENTS

| | | | |
|---|---|---|---|
| 5,841,874 A | 11/1998 | Kempke et al. | |
| 6,803,610 B2 * | 10/2004 | Koolhaas et al. | ............. 257/204 |
| 7,112,831 B2 * | 9/2006 | Kim et al. | ..................... 257/202 |
| 7,120,040 B2 | 10/2006 | Perry et al. | |
| 2004/0061143 A1 * | 4/2004 | Koolhaas et al. | ............. 257/204 |
| 2004/0223353 A1 * | 11/2004 | Kim et al. | ....................... 365/49 |

* cited by examiner

*Primary Examiner* — J. H. Hur
(74) *Attorney, Agent, or Firm* — Gardere Wynne Sewell LLP

(57) ABSTRACT

A ternary content addressable memory (TCAM) is formed by TCAM cells that are arranged in an array. Each TCAM cell includes a first and second SRAM cells and a comparator. The SRAM cells predominantly in use have a horizontal topology with a rectangular perimeter defined by longer and shorter side edges. The match lines for the TCAM extend across the array, and are coupled to TCAM cells along an array column. The bit lines extend across the array, and coupled to TCAM cells along an array row. Each match line is oriented in a first direction (the column direction) that is parallel to the shorter side edge of the horizontal topology layout for the SRAM cells in each CAM cell. Each bit line is oriented in a second direction (the row direction) that is parallel to the longer side edge of the horizontal topology layout for the SRAM cells in each CAM cell.

21 Claims, 11 Drawing Sheets

XY TERNARY CONTENT ADDRESSABLE MEMORY (TCAM) CELL AND ARRAY

TECHNICAL FIELD

The present invention relates to integrated memory circuits and in particular to XY ternary content addressable memory (TCAM) integrated circuits.

BACKGROUND

Content addressable memories (CAMs) are widely used in applications where extremely fast search on a database is required, for instance, in networking, imaging, voice recognition, etc. For example, in network engines, CAMs are used to perform a fast search in the database, corresponding to the header field of any packet, and forward the packet to the corresponding matched address.

There are two kinds of CAMs which are primarily used: a binary CAM (BCAM) and a ternary CAM (TCAM). Further, the TCAM referred to herein is referred to as an XY TCAM.

Since a very fast search is required, search performance is a critical performance parameter for CAMs. Also, the basic mechanism of search is very power intensive, owing to a parallel nature of operation. Hence, it is extremely important for an XY TCAM (Ternary CAM) design to have the best possible search performance along with having the least dynamic power expenditure for said search.

Reference is now made to FIG. 1 which is a schematic diagram of a standard XY ternary content addressable memory (TCAM) cell 10. The TCAM cell 10 is composed of two conventional six transistor (6T) static random access memory (SRAM) cells 12 and 14.

A first SRAM cell 12 forms a data cell of the TCAM cell 10 and includes two cross-coupled CMOS inverters 16 and 18, each inverter including a series connected p-channel and n-channel transistor pair. The inputs and outputs of the inverters 16 and 18 are coupled to form a latch circuit having a data true (DT) node 20 and a data complement (DC) node 22. The first SRAM cell 12 further includes two transfer (pass gate) transistors 24 and 26 whose gate terminals are coupled with a data word line node and are controlled by the signal present on a data word line (DWL). Transistor 24 is source-drain connected between the true node 20 and a node associated with a true bit line (BLT). Transistor 26 is source-drain connected between the complement node 22 and a node associated with a complement bit line (BLC).

A second SRAM cell 14 forms an enable cell of the TCAM cell 10 and includes two cross-coupled CMOS inverters 36 and 38, each inverter including a series connected p-channel and n-channel transistor pair. The inputs and outputs of the inverters 36 and 38 are coupled to form a latch circuit having an enable true (ET) node 40 and an enable complement (EC) node 42. The second SRAM cell 14 further includes two transfer (pass gate) transistors 44 and 46 whose gate terminals are coupled with an enable word line node and are controlled by the signal present on an enable word line (EWL). Transistor 44 is source-drain connected between the true node 40 and a node associated with the true bit line (BLT). Transistor 46 is source-drain connected between the complement node 42 and a node associated with the complement bit line (BLC).

The TCAM cell 10 is further composed of a comparator circuit 60 operable to compare the input search data bit with contents of data cell 12 and enable cell 14 and drive a match line (MATCH) accordingly. The comparator circuit 60 comprises a first transistor 80 and second transistor 82 having source-drain paths coupled in series between a node for the match line (MATCH) and a node for a reference voltage (for example, ground). The first transistor 80 has a gate terminal coupled to the true node 20 (DT) of the first SRAM (data) cell 12. The second transistor 82 has a gate terminal coupled to a true search node associated with a true search line (SLT). The comparator circuit 60 still further comprises a third transistor 90 and fourth transistor 92 having source-drain paths coupled in series between the node for the match line (MATCH) and the node for the reference voltage (for example, ground). The third transistor 90 has a gate terminal coupled to the true node 40 (ET) of the second SRAM (enable) cell 14. The second transistor 92 has a gate terminal coupled to a complement search node associated with a complement search line (SLC).

A TCAM with w words and b bits using the TCAM cells 10 of FIG. 1 is typically organized in an array (or matrix) format having w rows and b columns as shown in FIG. 2. Because there are two SRAM cells 12 and 14 per TCAM cell 10, the CAM array will include 2*w rows of SRAM cells. The memory has log(2)(w) address bits (A_bus), "b" data inputs (D), "b" data outputs (Q), "b" search inputs (SD) and "w" match outputs (MO). The memory further has an input pin "SEL" to control whether a read/write operation is to be performed on data cell or the enable cell, an input pin Chip Select (CSN) to control initiation of a valid cycle, an input pin Write Enable (WEN), to control if the initiated cycle is a Read or Write Cycle and another input pin Search Enable (Search) to control if the initiated cycle is a Search Cycle. The bit line ports "BLT" and "BLC" are shared between the data and enable cells 12 and 14 of each TCAM cell 10, and are also shared in a column with corresponding "BLT" and "BLC" ports respectively of all other TCAM cells in the same column (as defined by bit lines extending across the array along the columns). The data word line port "DWL" of the data cell is connected to corresponding "DWL" ports of all other data cells 12 in the same row (as defined by a data word line extending across the columns of the array along each row). Similarly, the enable word line port "EWL" is shared with the "EWL" ports of all other enable cells 14 in the same row (as defined by a data word line extending across the columns of the array along each row). The search data line ports "SLT" and "SLC" of each TCAM cell in a column are connected with "SLT" and "SLC" ports respectively of all other TCAM cells in the same column (as defined by search data lines extending across the rows of the array along each column). The port "MATCH" of a TCAM cell in any row is connected to corresponding "MATCH" ports of all other TCAM cells in the same row (as defined by a match line extending across the columns of the array along each row).

Operation of the TCAM array will now be described.

In the idle mode, the "DWL" and "EWL" lines are driven to logic low, and the "BLT/BLC" lines are precharged to logic high. Furthermore, the "SLT/SLC" lines are driven to logic low, and the "MATCH" line is precharged to logic high.

In the read operation, controlled by the combination of Chip Select (CSN)=0, Search Enable (SEARCH)=0 and Write Enable (WEN)=1, the "DWL" or "EWL" lines corresponding to the addressed row (A_bus), and depending on the requirement to read from the data cell or the enable cell (based on the logic state of "SEL"), are asserted to logic high. Precharge of the "BLT/BLC" lines of all columns is turned off resulting in discharge of one of "BLT" or "BLC" lines depending on whether "DT" or "DC" in case of read on data cell or "ET" or "EC" in case of read on the enable cell is logic low, corresponding to each column, in all columns. This discharge of either "BLT" or "BLC" line in each column is sensed by a corresponding sense amplifier and is transferred to corresponding output (Q) as a logic 0 or logic 1 value. The "DWL" or "EWL" lines are then driven back to logic low and the "BLT/BLB" lines are precharged back to logic high.

In the write operation, controlled by the combination of Chip Select (CSN)=0, Search Enable (SEARCH)=0 and Write Enable (WEN)=0, the "DWL" or "EWL" lines corresponding to an addressed row (A_bus), and depending on the requirement to write to the data cell or the enable cell (based on the logic state of "SEL"), are asserted to logic high. Precharge of the "BLT/BLC" lines of all columns is turned off and either "BLT" or "BLC" line for any column is driven to logic low (with the other maintained at logic high), depending respectively on a corresponding column's data to be written (D) state being either a logic 0 or logic 1 value. This results in writing a logic low on "DT" or "ET" and storing a logic high on "DC" or "EC" of the selected row of any column in case where a logic 0 value is written on that column, and vice versa. The "DWL" or "EWL" line is then driven back to logic low and the "BLT/BLC" lines are precharged back to logic high.

In the search operation, controlled by the combination of Chip Select (CSN)=0, Search Enable (SEARCH)=1, precharge of the "MATCH" lines of all the rows is turned off. The "SLT/SLC" lines of all the columns is driven by logic 0/1 values or logic I/O values, depending on the corresponding search data bit (SD); i.e., SLT=1 and SLC=0 if SD=1 and SLT=0 and SLC=1 if SD=0. The comparator of any column of any row affects the corresponding row's "MATCH" line as follows:

|  | SLT-SLC | | | |
| --- | --- | --- | --- | --- |
| DT-ET | 0 0 (Always hit) | 0 1 | 1 1 (Always miss) | 1 0 |
| 0 1 | 1 | 0 | 0 | 1 |
| 1 0 | 1 | 1 | 0 | 0 |

As can be seen from above truth table, the comparator of any bit of any row will NOT discharge the "MATCH" line of that row, if i) both the data cell 12 and enable cell 14 of that bit store a 0 OR ii) the stored bit in the data true node 20 (DT) in corresponding locations of data cells 12 does not match data driven on SLT AND correspondingly, the stored bit in the enable true node 40 (ET) in the enable cell 14 does not match data driven on SLC. This condition when the XY TCAM Cell of a particular location does not discharge a corresponding "MATCH" line may be called a "HIT on that bit". Similarly, the comparator of any bit of any row will discharge the "MATCH" line of that row, if i) both the data cell 12 and enable cell 14 of that bit store a 1 OR ii) either the stored bit in the data true node 20 (DT) in corresponding locations of data cells as well as driven data on SLT are 1 OR the stored bit in enable true node 40 (ET) in corresponding locations of enable cells as well as driven data on SLC are 1. This condition when the XY TCAM Cell of a particular location discharges the corresponding "MATCH" line may be called a "MISS on that bit". Thus, the "MATCH" line corresponding to any row will NOT discharge if there is a "HIT" on all the bits of that row, which may be called a "HIT on that row". Similarly, the "MATCH" line corresponding to any row will discharge if there is a "MISS" on one or more (at least one) bits of that row, which may be called a "MISS on that row". The "discharge" or "non-discharge" of all the "MATCH" lines is sensed by a next stage of sense amplifier, and is transferred as match output (MO) of the corresponding row. Thus, there are "w" match outputs (MO), of which, only few will go or remain high, corresponding to address locations which have a "HIT", and other address locations will either go low or remain low, corresponding to address locations which have a "MISS" (i.e., mismatch of at least one bit). The search lines "SLT" and "SLB" are then driven back to logic low, and "MATCH" lines are precharged back to logic high, making the TCAM ready to accept the next cycle.

Because there may be multiple "MISS" (mostly more MISS than HIT expected in a typical database search scenario) as result of a search operation, the corresponding discharge of match lines, and further precharge at the end of the cycle, constitutes a huge amount of dynamic power as well as peak power. Only the match lines of address locations which have a "HIT" do not discharge. It may also be observed that the slowest discharge of the "MATCH" line is for the case when there is a single bit "MISS" for any address location, and "MATCH" line sense enable signal has to be designed to be able to correctly sense the least amount of discharge on "MATCH" line corresponding to such a case of single bit MISS. However, in many other words (i.e., address locations), there is a possibility of multiple bit MISS, which would lead to a discharge of the MATCH lines of those words by a higher amount. This is the case in many instances in typical usage, leading to higher discharge and hence undesirable increase in dynamic power.

As previously described, an XY TCAM cell 10 is composed of two six transistor SRAM cells 12 and 14, and comparator logic 60, which are connected as described earlier. In any foundry for a given technology node, one or more six transistor SRAM cells and their corresponding layouts are available, which are optimized for either density, performance (read current) or lower voltage of operation. Layouts of these SRAM cells are optimized from various aspects, with even certain design rule derogations corresponding to that technology node, in order to achieve highest possible density for that particular cell. Considerable cost (time and effort) is incurred in tuning the process steps, in order to achieve a good yield for those memory cells. FIG. 3 illustrates a commonly used horizontal layout topology for a six transistor SRAM cell. The layout of FIG. 3 is referred to as a "horizontal" layout because the perimeter outline of SRAM has the shape of a rectangle and the cell layout is oriented with its longer side in the horizontal direction (corresponding to the row direction of the memory array).

The six transistor SRAM cell topology of FIG. 3 is used in an SRAM memory array organized in rows and columns with cells in the same row sharing the word lines and those in same columns sharing the bit lines. Since the cell is horizontally oriented (i.e., the height of the cell is much less than the width of the cell), for most of the practical range of number of words and bits the memory array is able to have much shorter bit lines than word lines, and hence a lesser capacitance on bit lines. This makes the FIG. 3 cell topology preferred one for an SRAM since bit line capacitance is one primary parameter governing SRAM read performance.

The cell topology for this "horizontal" memory cell of FIG. 3 has remained more or less the same across the past many process technologies, and is likely to remain the same in future technologies (i.e., the individual cells in SRAM memories will continue to have a "horizontal" aspect ratio), owing to the fact that it is able to minimize the capacitance on the bit lines.

Also the aspect ratio of the SRAM cell (i.e., "x dimension/y dimension") is progressively becoming more and more skewed towards the x dimension with technology evolution.

As earlier mentioned, tuning the process for any given memory cell (for example, to guarantee good yield) incurs a high cost. Hence, in general, the two SRAM cells required for a TCAM cell in any technology are simply taken as one of the SRAM cells on offer in that process technology, and additional circuitry is provided for implementing the comparator portion. FIG. 4 illustrates the topology for a conventional TCAM cell which is based on the use of two SRAM cell topologies (FIG. 3) plus device layout supporting the comparator portion. FIGS. 5A, 5B and 5C show the layout for metal 2, metal 3 and metal 4 for the conventional TCAM cell topology of FIG. 4. Dotted outlines of the layouts of the SRAM cells 12 and 14 and comparator 60 circuitry for the TCAM cell 10 are provided in FIGS. 5A, 5B and 5C.

The FIG. 4 TCAM cell is organized, as previously explained, with cells in adjacent rows sharing the "BLT/BLC" lines, and those in adjacent columns sharing the "DWL", "EWL" and "MATCH" lines. Even with two SRAM cells that correspond to data and enable cells being provided one over another in adjacent rows, the aspect ratio of the cell is still quite skewed in favor of the x dimension (i.e., x dimension>y dimension). Also, in order to make the comparator faster, if the comparator devices are made bigger, then for the FIG. 4 topology, there is a further increase in the horizontal extent of the cell, resulting in an even higher skew in aspect ratio. Since the "MATCH" line travels horizontally (i.e., between adjacent cells 10 in the array in the horizontal direction across columns along the rows and parallel to the longer side edge of the rectangular-shaped layout), the higher horizontal extent results in increased routing capacitance of the "MATCH" line, which results in increased dynamic power and slower search operation speed. To emphasize this point, reference is made to FIGS. 2 and 5B which clearly illustrate the bit lines travelling vertically between adjacent cells 10 in the array in the vertical (column) direction across the rows along columns parallel to the shorter side edge of the rectangular-shaped SRAM cell layout, while FIGS. 2 and 5C clearly illustrate the MATCH line travelling horizontally between adjacent cells 10 in the array in the horizontal (row) direction across columns along rows parallel to the longer side edge of the rectangular-shaped SRAM cell layout.

There is a need in the art for a better TCAM cell and array topology.

It is possible to present a new topological organization of the devices for the TCAM cell, including those of the six transistor SRAM cell, in order to achieve a lower "MATCH" line capacitance. The technical literature discloses a number of possibilities, but these possibilities exhibit known limitations including: high cost incurred in order to fully validate all aspects of the new memory cell, including the SRAM cell portion; and loss of the density advantage associated with the design rules derogations in existing SRAM cell topologies which are managed in manufacturing through rigorous and iterative process with a new topology.

Another method to improve the performance of the search operation is to increase the strength (i.e., width) of the transistors forming the comparator portion, so as to enable faster "MATCH" line discharge for the case of "MISS". The limitation associated with this solution is that capacitance of "MATCH" line also increases because of larger devices on "MATCH" line and also in the prior art layout topology, increase in width of comparator devices implies increasing the width of the TCAM cell, which means further increase in routing capacitance of the "MATCH" line. This in turn implies limited gain in both dynamic power as well as search speed performance, as the increase in strength of the comparator devices is partially offset by an increase in capacitance of the "MATCH" line due to the use of larger devices.

Thus, there would be an advantage if an operationally improved TCAM design could be provided which advantageously utilized the well known horizontal SRAM topology while also favoring a capacitance reduction of the "MATCH" line.

SUMMARY

In an embodiment, a ternary content addressable memory (TCAM) comprises: a plurality of TCAM cells arranged in an array; each TCAM cell comprising a first SRAM cell, a second SRAM cell and a comparator circuit, the first and second SRAM cells having a horizontal topology with a shorter side edge and a longer side edge; and a plurality of match lines, each match line extending across the array and coupled to plural TCAM cells, each match line oriented in a first direction that is parallel to the shorter side edge of the horizontal topology for the first and second SRAM cells in said plural TCAM cells.

In an embodiment, a ternary content addressable memory (TCAM) comprises: a plurality of TCAM cells arranged in an array including a plurality of rows and a plurality of columns; and wordline decoder circuitry coupled to the plurality of rows. Each TCAM cell comprises a first SRAM cell, a second SRAM cell and a comparator circuit. Each SRAM cell has a horizontal topology layout with a rectangular perimeter defined by a longer side edge and a shorter side edge, wherein the longer side edge is oriented parallel to the columns of the array and the shorter side edge is oriented parallel to the rows of the array.

BRIEF DESCRIPTION OF THE DRAWINGS

For a better understanding of the embodiments, reference will now be made by way of example only to the accompanying figures in which.

DETAILED DESCRIPTION OF THE DRAWINGS

FIGS. 1-5C have been previously described.

Search operations are expected to be more frequent in a TCAM as compared to read and write operations. The reason for this is because it is anticipated that the database will not be required to be updated that frequently. Hence, the organization of a TCAM cell in such a way so as to favor read/write performance is not ideal. However, the prior art TCAM cell designs and topological layouts emphasize read/write performance, because the bitline is laid out along the shorter edge of SRAM cell.

Embodiments discussed herein propose an alternate organization of the TCAM array which preferentially continues use of the existing "horizontal" SRAM cell within each TCAM cell, but favors a capacitance reduction of the "MATCH" line (at the expense of increasing bit line "BLT/BLC" capacitance). In this regard the increase in bit line "BLT/BLC" capacitance is of little consequence because this factor primarily affects read/write performance. The reduction in "MATCH" line capacitance, however, will have a beneficial effect on the search operation.

Figure 6:
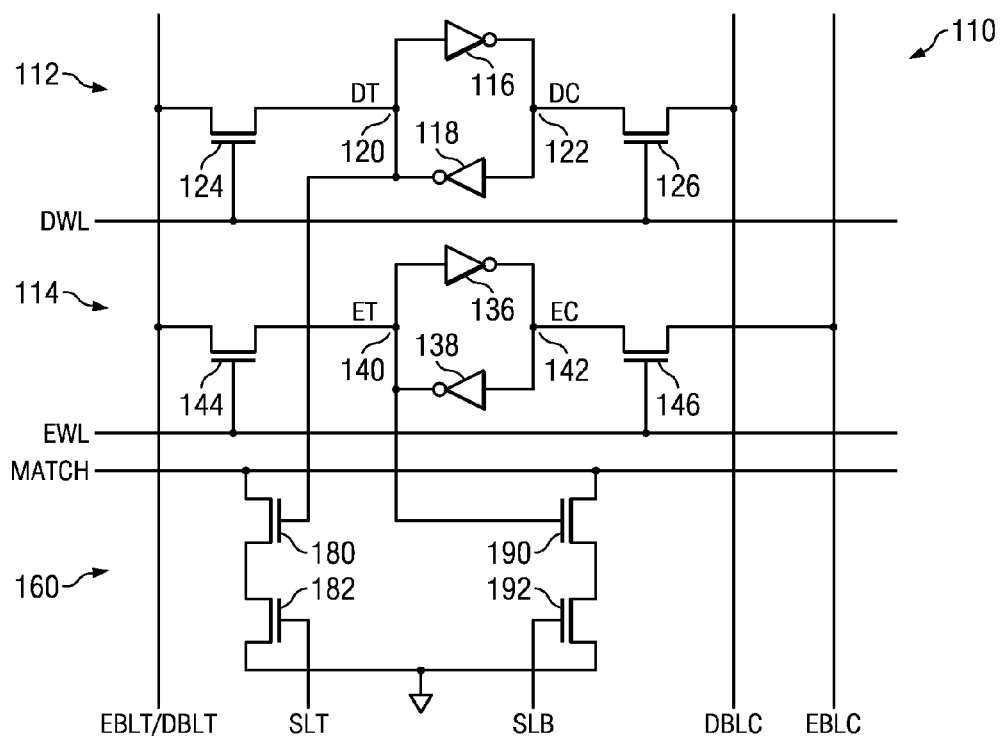
FIG. 6 is a schematic diagram of an XY ternary content addressable memory (TCAM) cell in accordance with an embodiment.

Reference is made to FIG. 6 which is a schematic diagram of an XY ternary content addressable memory (TCAM) cell 110 in accordance with an embodiment. The TCAM cell 110 is composed of two conventional six transistor (6T) static random access memory (SRAM) cells 112 and 114.

A first SRAM cell 112 forms a data cell of the TCAM and includes two cross-coupled CMOS inverters 116 and 118, each inverter including a series connected p-channel and n-channel transistor pair. The inputs and outputs of the inverters 116 and 118 are coupled to form a latch circuit having a data true (DT) node 120 and a data complement (DC) node 122. The first SRAM cell 112 further includes two transfer (pass gate) transistors 124 and 126 whose gate terminals are coupled with a data word line node and are controlled by the signal present on a data word line (DWL). Transistor 124 is source-drain connected between the true node 120 and a node associated with a true bit line (DBLT). Transistor 126 is source-drain connected between the complement node 122 and a node associated with a complement bit line (DBLC).

A second SRAM cell 114 forms an enable cell of the TCAM includes two cross-coupled CMOS inverters 136 and 138, each inverter including a series connected p-channel and n-channel transistor pair. The inputs and outputs of the inverters 136 and 138 are coupled to form a latch circuit having an enable true (ET) node 140 and an enable complement (EC) node 142. The second SRAM cell 114 further includes two transfer (pass gate) transistors 144 and 146 whose gate terminals are coupled with an enable word line node and are controlled by the signal present on an enable word line (EWL). Transistor 144 is source-drain connected between the true node 140 and a node associated with the true bit line (EBLT). It will be noted that the true bit line (EBLT) for the second SRAM cell 114 is the same true bit line (DBLT) for the first SRAM cell 112. Transistor 146 is source-drain connected between the complement node 142 and a node associated with the complement bit line (EBLC). It will be noted that the complement bit line (EBLC) for the second SRAM cell 114 is different than the complement bit line (DBLC) for the first SRAM cell 112. Thus, the TCAM cell 110 includes three bit lines: a shared true bit line (DBLT/EBLT) and separate complement bit lines (DBLC and EBLC).

The TCAM cell 110 is further composed of a comparator circuit 160 operable to compare the input search data bit with contents of data cell 112 and enable cell 114 and drive the match line ("MATCH") accordingly. The comparator circuit 160 comprises a first transistor 180 and second transistor 182 having source-drain paths coupled in series between a match line (MATCH) and a reference voltage (for example, ground). The first transistor 180 has a gate terminal coupled to the true node 120 (DT) of the first SRAM (data) cell 112. The second transistor 182 has a gate terminal coupled to a true search node associated with a true search line (SLT). The comparator circuit 160 still further comprises a third transistor 190 and fourth transistor 192 having source-drain paths coupled in series between the match line (MATCH) and the reference voltage (for example, ground). The third transistor 190 has a gate terminal coupled to the true node 140 (ET) of the second SRAM (enable) cell 114. The second transistor 192 has a gate terminal coupled to a complement search node associated with a complement search line (SLC).

Figure 7:
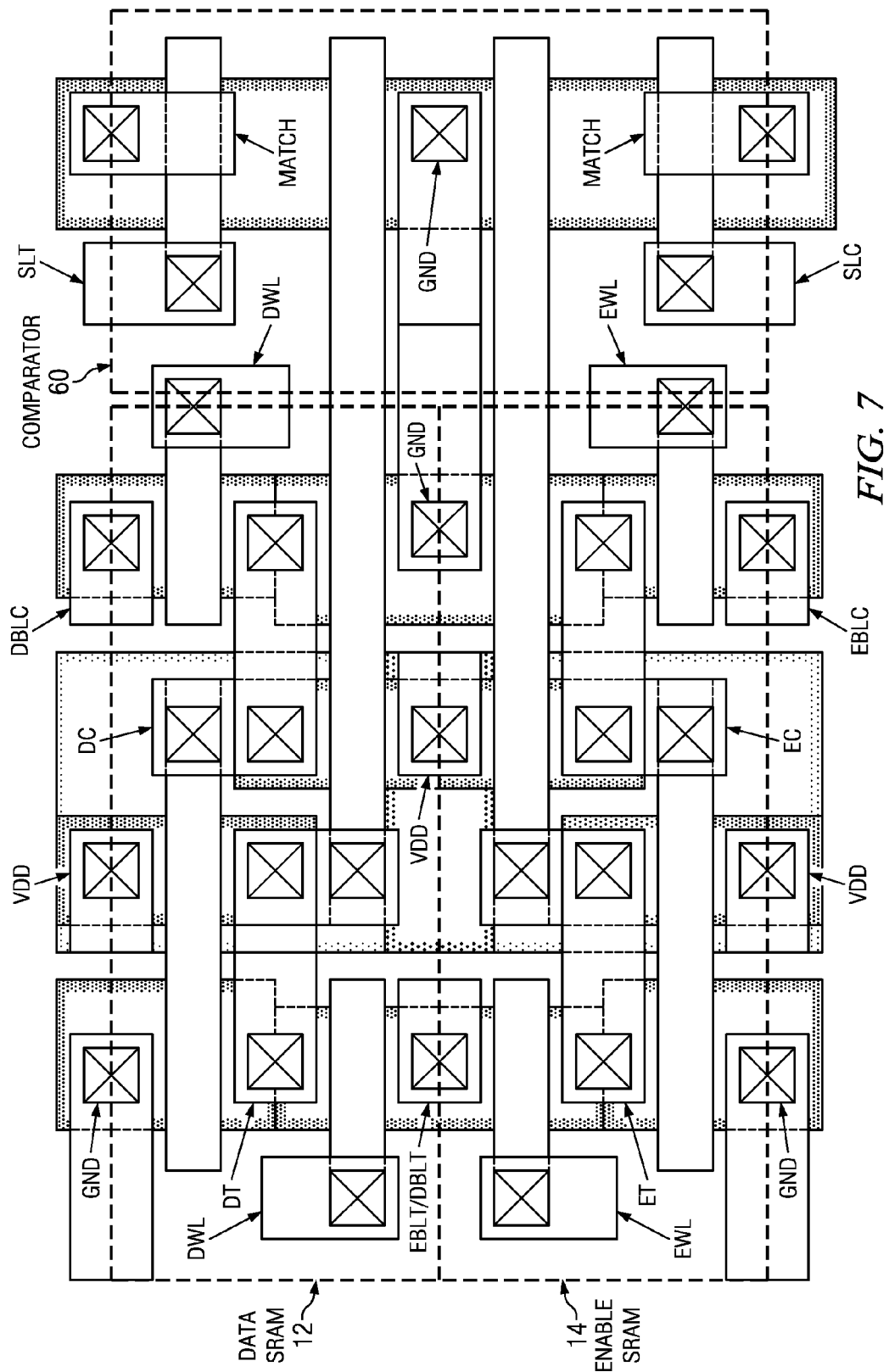
FIG. 7 illustrates the topology for the TCAM cell of FIG. 6.

FIG. 7 illustrates the topology for the TCAM cell 110 of FIG. 6 which is based on the use of two SRAM cell topologies (FIG. 3) plus device layout supporting the comparator portion, as well as the use of a shared true bit line (DBLT/EBLT) and separate complement bit lines (DBLC and EBLC) for each cell 110.

Figure 8:
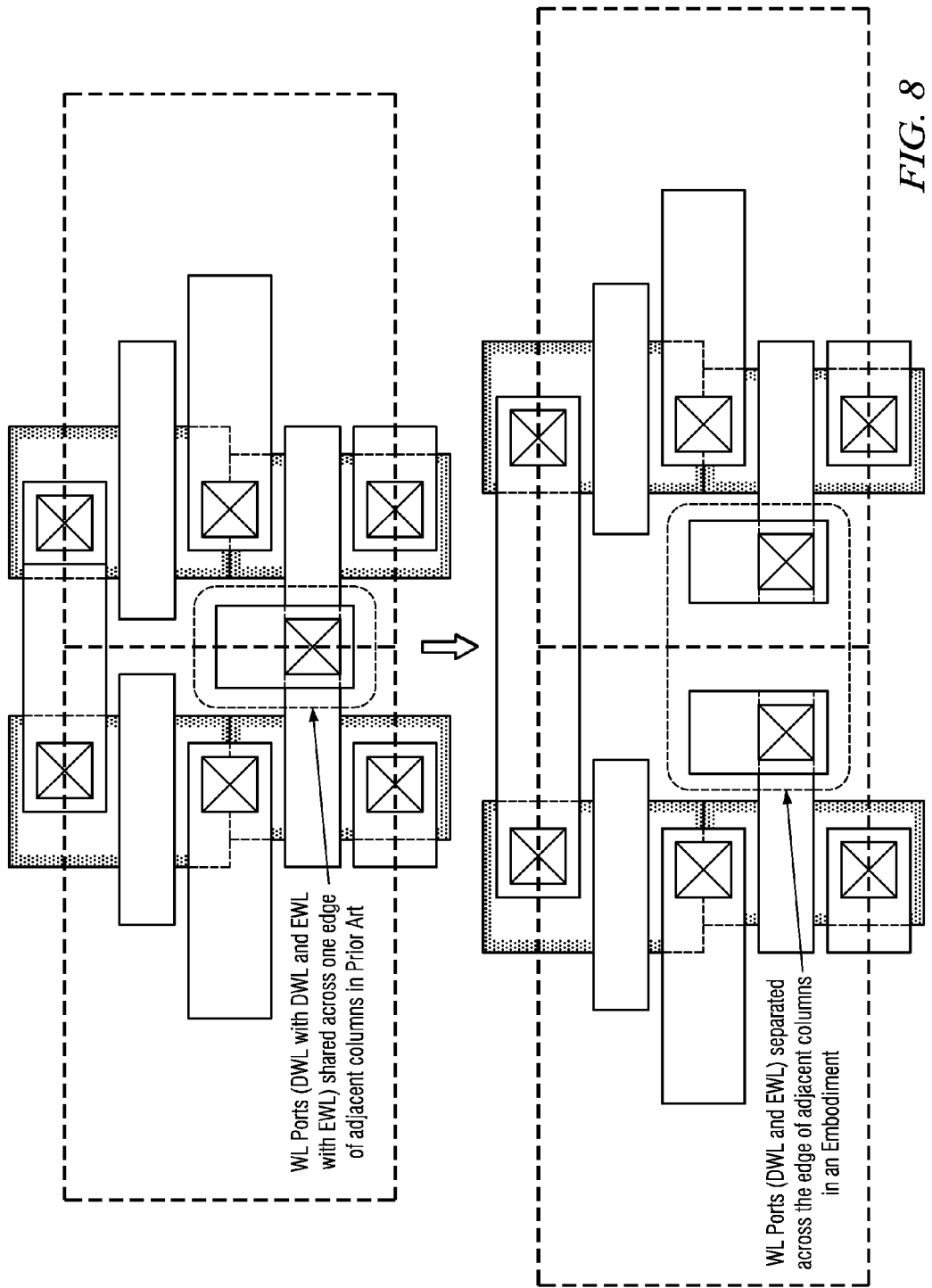
FIG. 8 shows a modification needed in a TCAM array over conventional TCAM array at the abutment of two columns along that shorter edge of the two SRAM cells where comparator is not introduced, in accordance with an embodiment

FIG. 8 illustrates a specific modification needed in an array of TCAM cell 110 of FIG. 6. In the original array of TCAM cell 10 of FIG. 1, as shown in the top of FIG. 8, two columns of TCAM cell 10 are placed in such a way that the wordline ports DWL and EWL of the two SRAM cells 12 and 14 respectively get connected automatically between two adjacent columns because of polysilicon overlap, on that vertical edge of the TCAM cell 10 where the comparator is not introduced. However, in the array of TCAM cell 110 of FIG. 6, as shown in the bottom of FIG. 8, the two columns of TCAM cell 110 are spaced apart in order to have a physical separation between the wordline ports DWL and EWL of the adjacent columns of two SRAM cells 112 and 114, respectively.

Figure 9A:
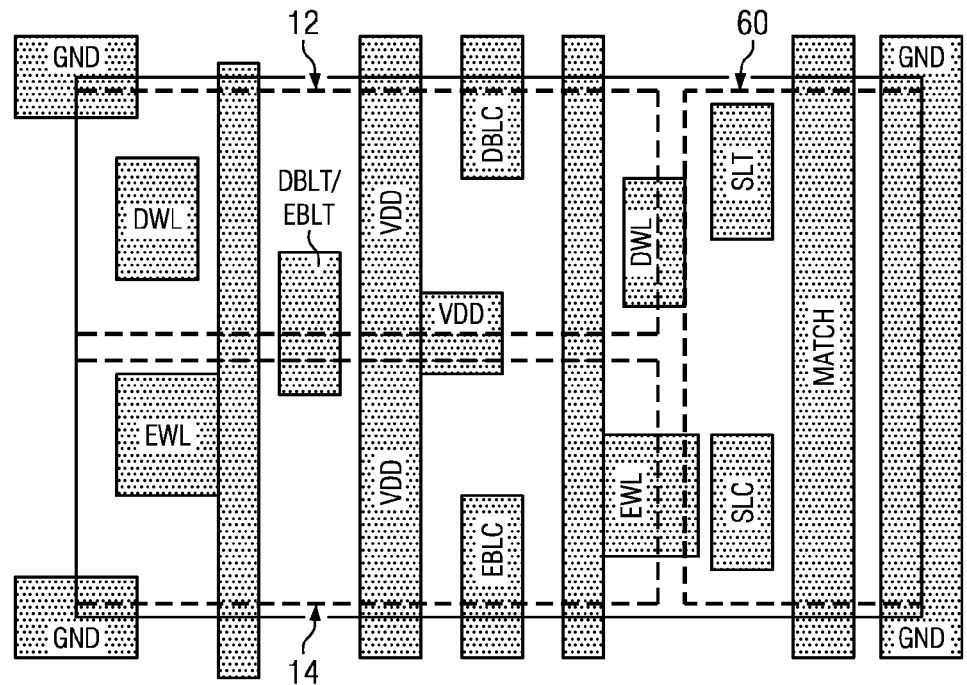
FIGS. 9A, 9B and 9C show the layout for metal 2, metal 3 and metal 4, respectively, for use with the TCAM cell topology of FIG. 7.
Figure 9B:
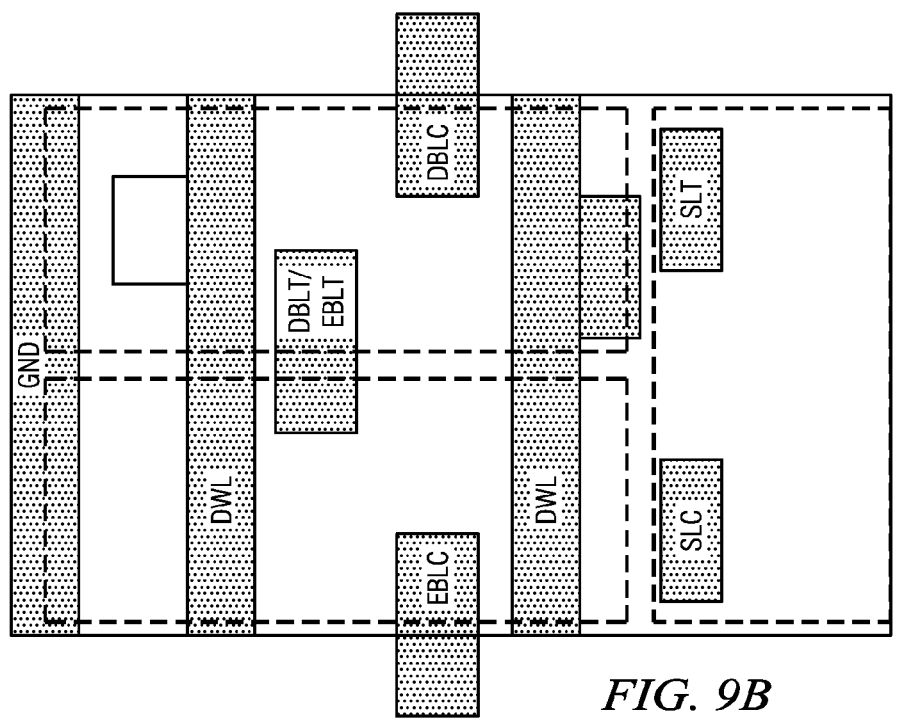
Figure 9C:
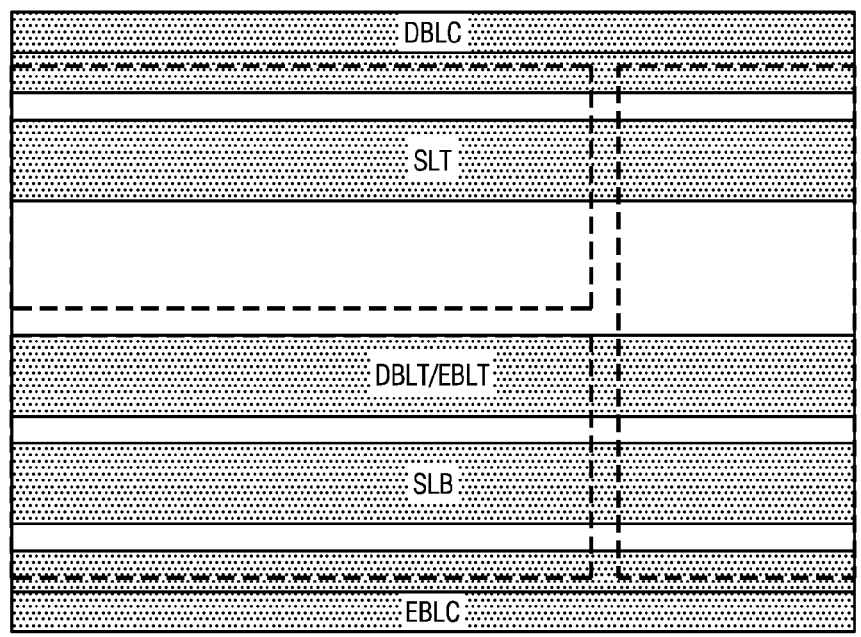

FIGS. 9A, 9B and 9C show the layout for metal 2, metal 3 and metal 4 for the TCAM cell 110 topology of FIG. 7. Dotted outlines of the layouts of the SRAM cells 112 and 114 and comparator 160 circuitry for the TCAM cell 110 are provided in FIGS. 9A, 9B and 9C.

Figure 10:
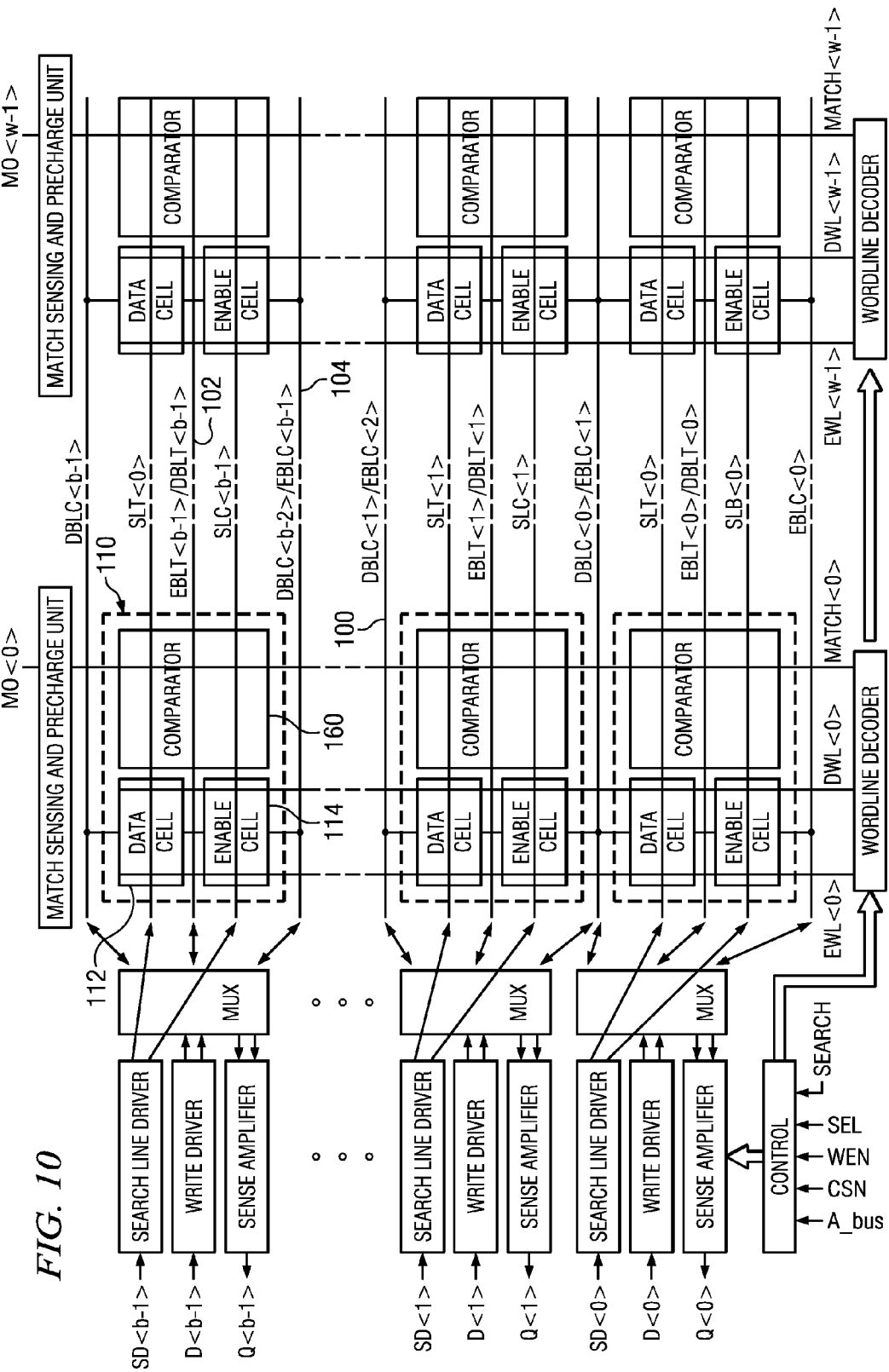
FIG. 10 is a block diagram of TCAM array in accordance with an embodiment.

A TCAM using the TCAM cells 110 of FIG. 6 is accordingly organized in an array (or matrix) format having b rows and w columns as shown in FIG. 10. Thus, as opposed to the array of FIG. 2, the array of FIG. 10 presents a TCAM with "w" words and "b" bits organized as "w" columns and "b" rows (i.e., the number of rows and columns has been interchanged).

The bit lines "BLT/BLC" and the search data lines "SLT/SLC" are oriented to travel horizontally (across the columns and along the rows). This horizontal orientation means that the bit lines "BLT/BLC" and the search data lines "SLT/SLC" extend across the array between adjacent cells 110 in the array in a horizontal (row) direction parallel to the longer side edge of the rectangular-shaped SRAM cell 112 and 114 layout. This is the opposite of the bit line "BLT/BLC" and the search data line "SLT/SLC" column orientation shown in FIG. 2. The row orientation of the bit lines "BLT/BLC" and the search data lines "SLT/SLC" parallel to the longer side edge of the rectangular-shaped SRAM cell 112 and 114 layout will result in an increase in capacitance on these lines (compared to the column direction configuration of FIG. 2). However, because the array of cells is for a TCAM, not an SRAM, the increase in bit line "BLT/BLC" capacitance is of little or no concern because read and write operations with respect to the cells 112 and 114 are expected to occur infrequently (in comparison to search operations), and the increased latency of read/write operations may be acceptable to a system using TCAM. Also, increase in capacitance of search data lines "SLT/SLC" has negligible impact only on the search speed performance of the TCAM, as the impact can be controlled by increasing the strength of search line drivers in the I/O circuitry.

Figure 1:
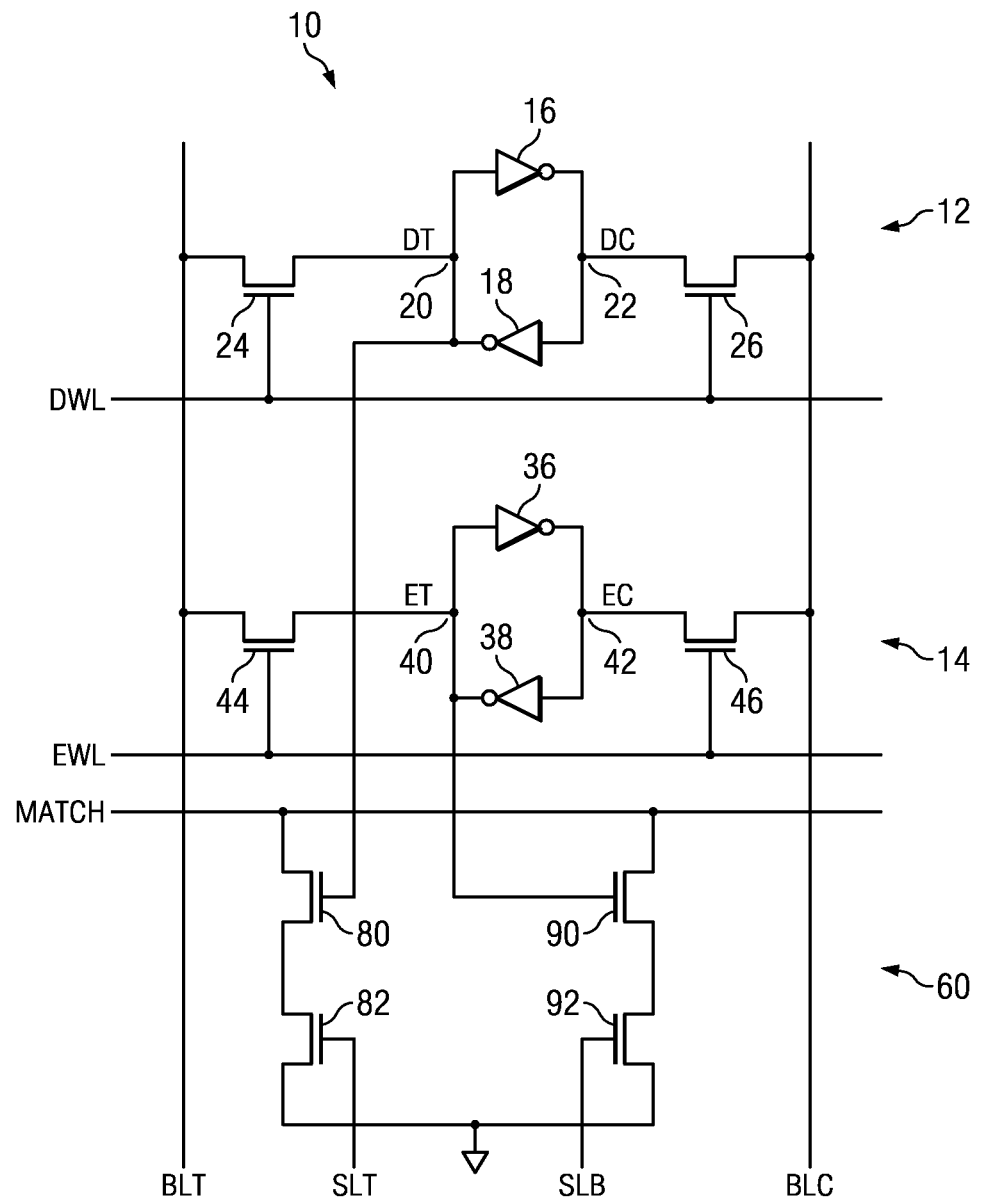
FIG. 1 is a schematic diagram of a standard XY ternary content addressable memory (TCAM) cell.
Figure 2:
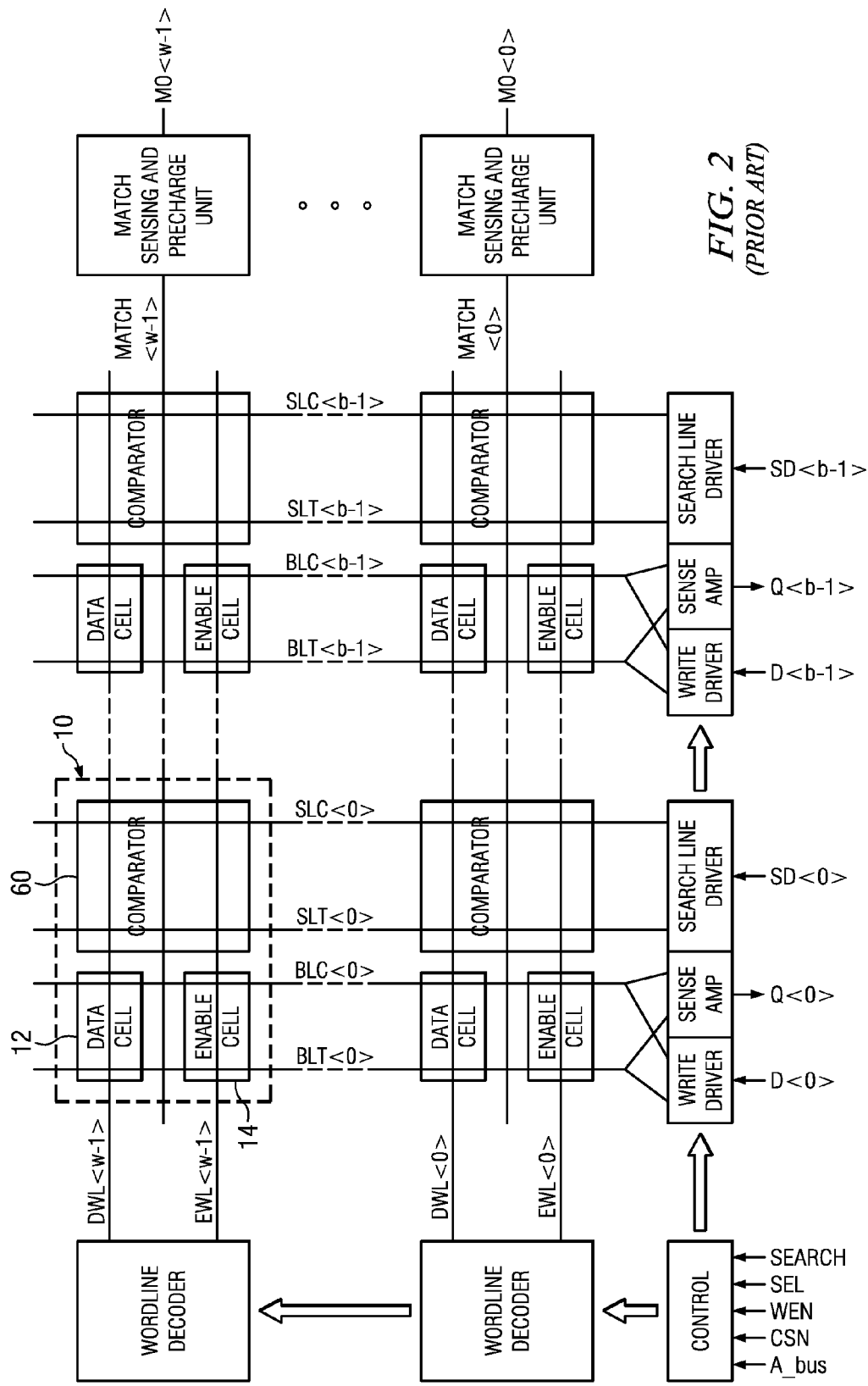
FIG. 2 is a block diagram of a conventional TCAM array.
Figure 3:
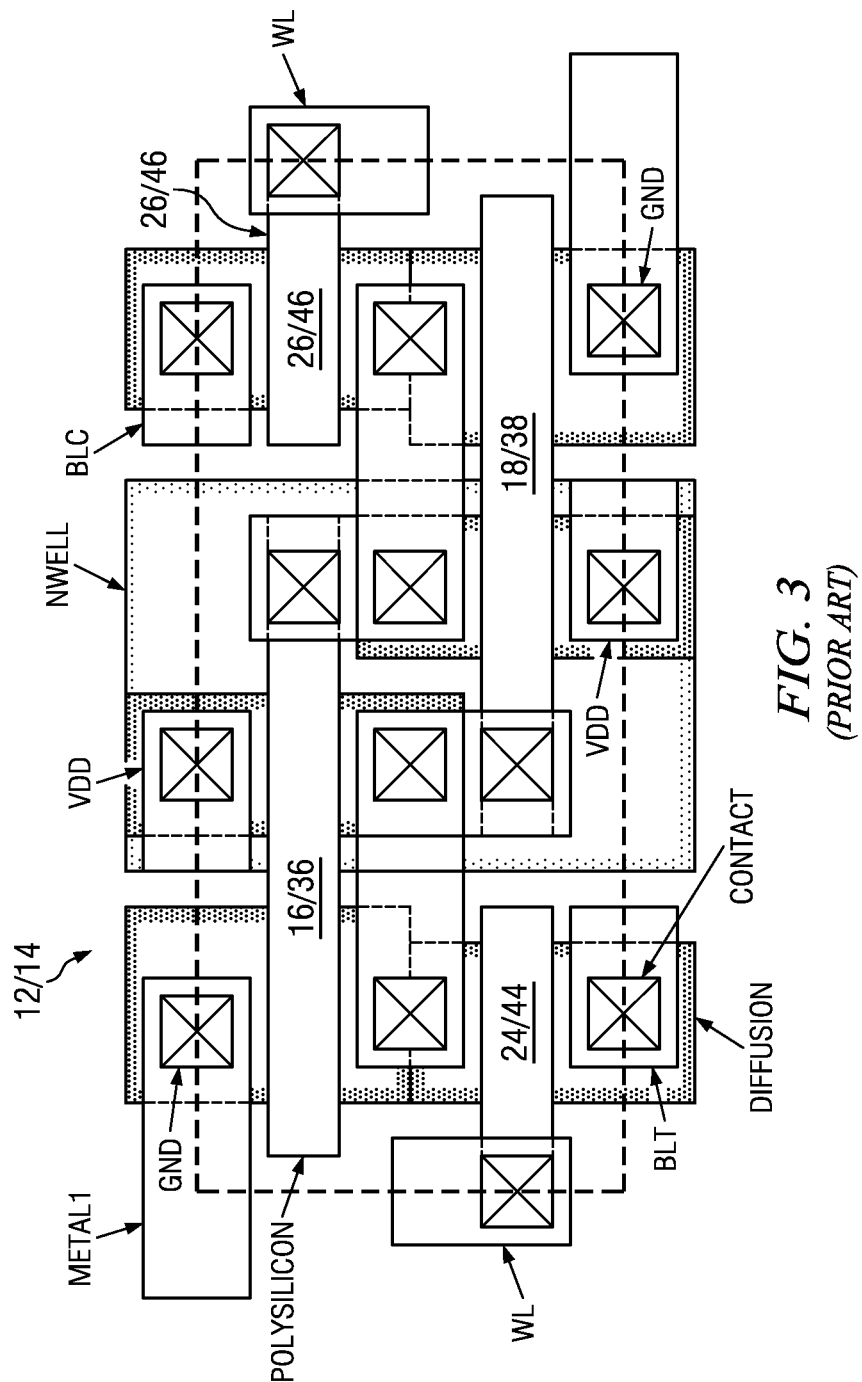
FIG. 3 illustrates the topology for a conventional SRAM cell.
Figure 4:
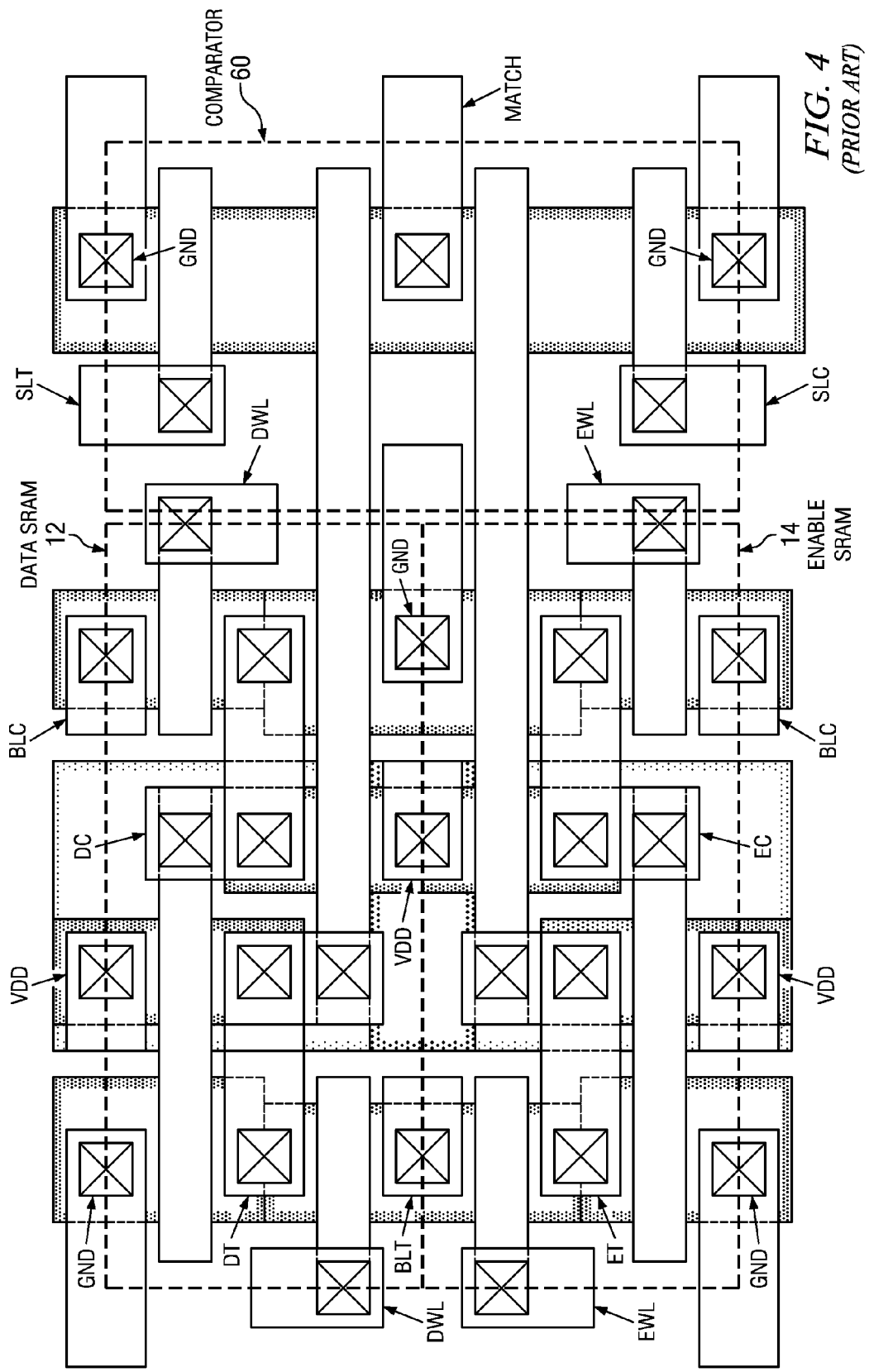
FIG. 4 illustrates the topology for a conventional TCAM cell.
Figure 5A:
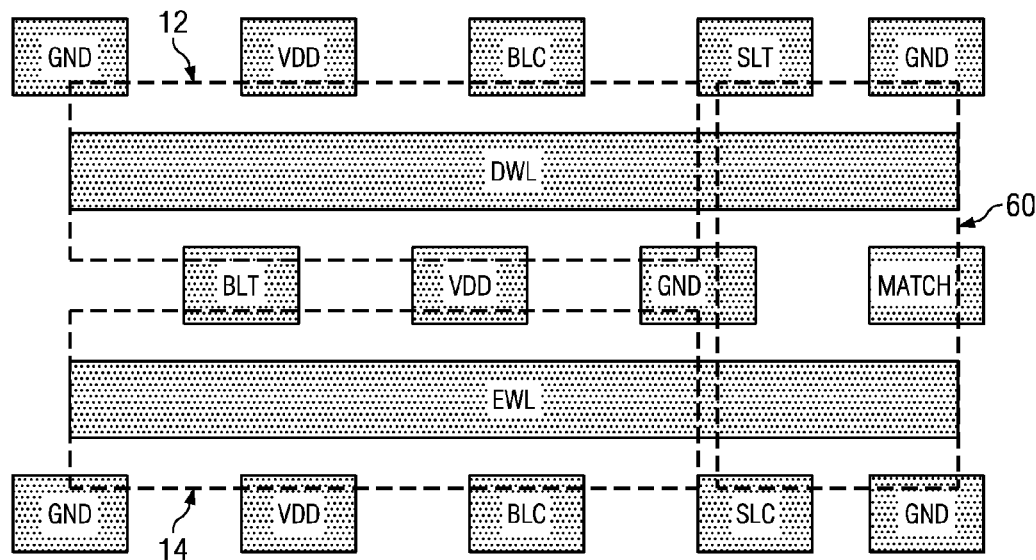
FIGS. 5A, 5B and 5C show the layout for metal 2, metal 3 and metal 4, respectively, for the conventional TCAM cell topology of FIG. 4.
Figure 5B:
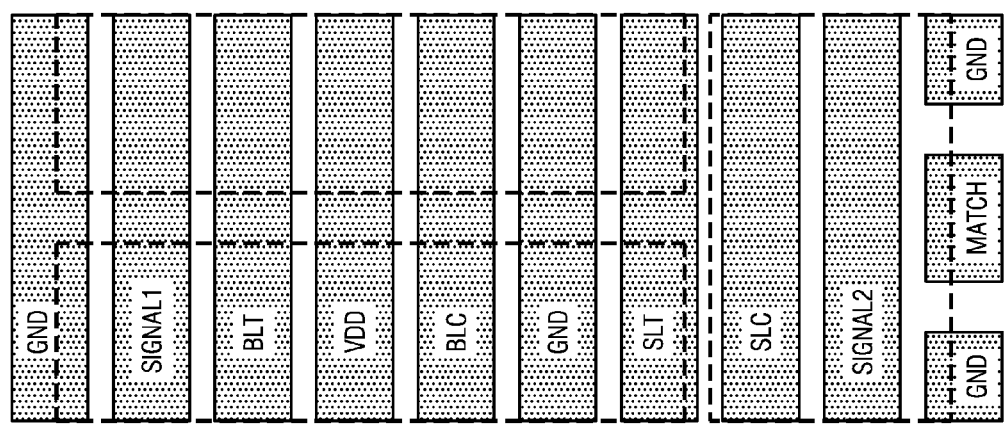
Figure 5C:
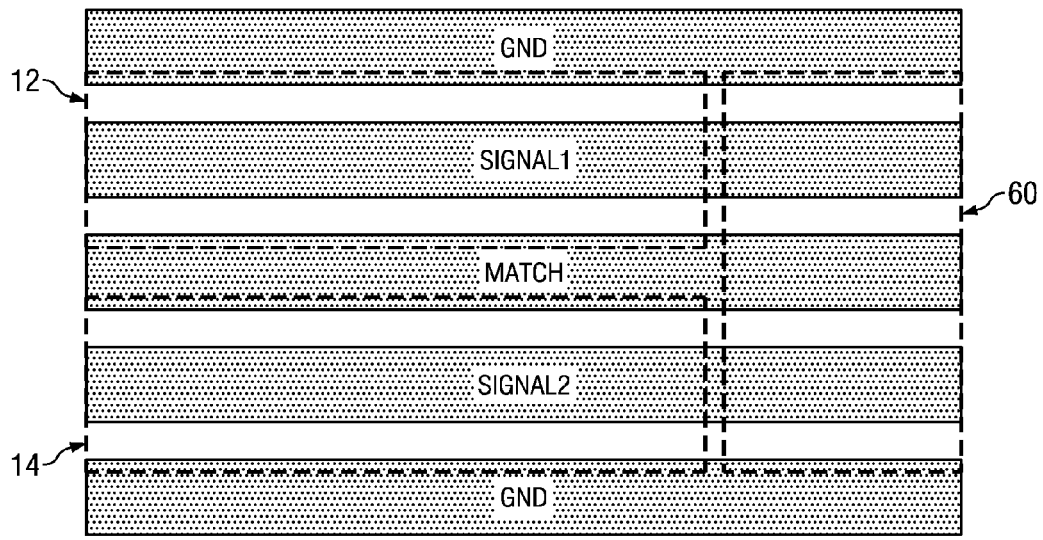

As opposed to the prior art configuration of FIG. 2, where the data and enable cells were organized as two memory cells in different rows on the same bit line, in the architecture of FIG. 10 the data and enable cells are organized as two memory cells, still physically located in adjacent rows of a single column, but organized in a multiplexed fashion, although sharing their respective "BLT" nodes with each other, and sharing their "BLC" nodes with the enable and data cells respectively of adjoining rows (i.e., the enable cell of any row shares its "BLC" with the data cell in the row below it, and similarly the data cell in any row shares its "BLC" with the enable cell in a row above it). Both the data and enable cells of a row share their "BLT" with each other. Data and enable cells of any row also share their "BLT" and "BLC" with data and enable cells of other data and enable cells respectively, in other columns of the same row (i.e., "BLT" and "BLC" are oriented across columns).

This requires a multiplexing circuit (MUX) structure to be built in the "BLT/BLC" precharge, sense amplifier and write driver region to the left of TCAM array, selectable with the "SEL" pin. Thus, in the FIG. 10 configuration, the SEL signal not only controls "DWL" or "EWL" generation (as in FIG. 2), but also controls MUX operation to make the proper bit line selection. Therefore, "SEL" still continues to select either "DWL" (when SEL=0) or "EWL" (when SEL=1). If SEL=0 (select Data cell), then the "BLT/BLC" of the data cell is connected to the sense amplifier or write driver through the MUX. Conversely, if SEL=1 (select Enable cell) then the "BLT/BLC" of the Enable cell is connected to the sense amplifier or write driver through the MUX. This enables read as well as update (write) operation from/on either the Data field or Enable field of any address location of the TCAM, as desired.

The "MATCH" lines and the word lines "DWL" and "EWL" are oriented to travel vertically (across rows of the array along the columns), and are shared with respective ports of TCAM cells across adjacent rows. This vertical orientation means that the "MATCH" lines and the word lines "DWL" and "EWL" extend between adjacent cells 110 in the array in a vertical direction parallel to the shorter side edge of the rectangular-shaped SRAM cell 112 and 114 layout. The orientation of the "MATCH" lines and the word lines "DWL" and "EWL" parallel to the shorter side edge of the rectangular-shaped SRAM cell 112 and 114 layout will result in a decrease in capacitance (compared to the configuration of FIG. 2). The reason for this is that the height of the TCAM cell is less than the width of the TCAM cell, and thus a vertically extending "MATCH" line across the array will have a lesser length (and hence lesser capacitance). This is a significant benefit because the search operation will be improved in that search speed is increased while search power is decreased. There still continue to be two separate word lines for the data and enable cells of any word, as was the case with the FIG. 2 layout, but in FIG. 9 the "DWL" and "EWL" now travel vertically as opposed to horizontally (i.e., across rows along the columns of the array).

The "D", "Q" and "SD" pins, the write and search line driver, precharge logic and the sense amplifier, which were below the TCAM array in prior art FIG. 2, are now placed at the left side of the TCAM array in FIG. 10. The word line decoders, which were on the left side of the TCAM array in prior art FIG. 2, are now placed below the TCAM array in FIG. 10. The "MO" pins and "MATCH" line sensing and precharge logic, which were placed to the right of the TCAM array in prior art FIG. 2, are now placed on top of TCAM array in FIG. 10.

The bit lines "EBLT/DBLT/EBLC/DBLC" are shared across adjacent columns, and across adjacent rows where the passgate devices share their drains because of layout constraint. This means that for every row of TCAM cells (which now corresponds to every bit of TCAM cell), there will be 3 bit lines—one bit line 100 that is shared between the current row and a lower row (i.e., a row below the current row), another bit line 102 that is shared between data and enable cells of the current row, and a third bit line 104 that is shared between the current row and an upper row (i.e., a row above the current row).

Since the "MATCH" line travels vertically (i.e., extending across rows of the array through adjacent cells 110 in the vertical direction parallel to the shorter side edge of the rectangular-shaped SRAM cell layout and along the columns), the lower vertical extent results in decreased routing capacitance of the "MATCH" line, which results in decreased dynamic power and a faster search operation. To emphasize this point, reference is made to FIGS. 9C and 10 which clearly illustrate the bit lines extending across columns of the array through adjacent cells 110 in the horizontal row direction parallel to the longer side edge of the rectangular-shaped SRAM cell layout, while FIGS. 9B and 10 clearly illustrate the MATCH line extending across rows of the array through adjacent cells 110 in the vertical column direction parallel to the shorter side edge of the rectangular-shaped SRAM cell layout.

The layout for metal 2, metal 3 and metal 4 proposed by FIGS. 9A, 9B and 9C show more vertical signals like those shown in state of the art (SIGNAL1, SIGNAL2 in current cell) may be taken vertically in metal 3 through available vacant metal 3 tracks. Additionally, one more global signal can be taken horizontally in metal 4 only (like SIGNAL3 in current cell). If required, more global signals may be taken over the TCAM array in metal-5. The power mesh may be drawn in metal 5 or metal 6 (not shown), as per requirement. The configuration of FIG. 10 achieves at least 10% reduction in capacitance of the "MATCH" line (the reduction could be higher, perhaps up to 20-25% depending on various technology parameters), because of a "MATCH" run length reduction by 58% (in a particular technology, with results expected to be similar across other technologies); the reduction in capacitance leads to an improvement in search performance and power. One noted drawback is an area impact of 7.07% in TCAM cell area (this result for a particular technology). This is due to spacing out of word line edge across adjacent columns, as shown in the bottom of FIG. 8, to permit the new orientations of the lines. This results in about a 3-4% impact in total TCAM area for a typical instance size. Another drawback is an impact as described above on read/write performance.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A content addressable memory (CAM), comprising:
a plurality of CAM cells arranged in an array including columns and rows; each CAM cell comprising a first SRAM cell, a second SRAM cell and a comparator circuit, the first and second SRAM cells having a horizontal topology layout with a longer side edge and a shorter side edge;
a plurality of match lines, each match line extending across the array and coupled to plural CAM cells, each match line oriented in a first direction that is parallel to the shorter side edge of the horizontal topology for the first and second SRAM cells in said plural CAM cells;

a plurality of bit lines, each bit line extending across the array and coupled to plural CAM cells, each bit line oriented in a second direction that is both perpendicular to the first direction and parallel to the longer side edge of the horizontal topology layout for the first and second SRAM cells in said plural CAM cells;

wherein the plurality of bit lines comprise:

a plurality of first bit lines, one first bit line per column or row of the array, each first bit line shared as a true bit line by the first and second SRAM cells in each CAM cell; and a plurality of second bit lines, one second bit line per column or row of the array, wherein second bit lines are shared as a complement bit line by the first SRAM cell in one CAM cell and the second SRAM cell in a CAM cell in an adjoining column or row.

2. The CAM of claim 1, wherein the plurality of match lines extend across the array in the first direction along columns of the array.

3. The CAM of claim 2, further comprising a match line sensing circuit for each column of the array, each match line sensing circuit coupled to one of the plurality of match lines.

4. The CAM of claim 1, further comprising a plurality of first word lines, each first word extending across the array and coupled to first SRAM cells within plural CAM cells, each first word line oriented in the first direction that is parallel to the shorter side edge of the horizontal topology layout for the first and second SRAM cells in said plural CAM cells.

5. The CAM of claim 4, further comprising a plurality of second word lines, each second word extending across the array and coupled to second SRAM cells within plural CAM cells, each second word line oriented in the first direction that is parallel to the shorter side edge of the horizontal topology layout for the first and second SRAM cells in said plural CAM cells.

6. The CAM of claim 5, wherein the plurality of first and second word lines extend across the array in the first direction along columns of the array.

7. The CAM of claim 6, further comprising a wordline decoder circuit for each column of the array, each wordline decoder circuit coupled to one of the plurality of first word lines and one of the plurality of second word lines.

8. The CAM of claim 1, wherein the plurality of bit lines extend across the array in the first direction along rows of the array.

9. The CAM of claim 1, wherein the plurality of bit lines further comprise a plurality of third bit lines, one third bit line per row of the array, wherein third bit lines are shared as a complement bit line by the second SRAM cell in one CAM cell and the first SRAM cell in a CAM cell in an adjoining column or row.

10. The CAM of claim 9, further comprising, for each row:
a write driver;
a sense amplifier; and
a MUX circuit, said MUX circuit operable to selectively couple the write driver and sense amplifier to the first, second and third bit lines of each row.

11. The CAM of claim 1, wherein the plurality of CAM cells comprise a plurality of ternary CAM cells.

12. A content addressable memory (CAM), comprising:
a plurality of CAM cells arranged in an array including a plurality of rows and a plurality of columns; and
a plurality of word line decoders, wherein each wordline decoder is coupled to a particular column;

wherein each CAM cell comprises a first SRAM cell, a second SRAM cell and a comparator circuit;

wherein each SRAM cell has a horizontal topology layout with a rectangular perimeter defined by a longer side edge and a shorter side edge; and wherein the longer side edge is oriented parallel to the rows of the array and the shorter side edge is oriented parallel to the columns of the array;

a plurality of bit lines, each bit line extending across the array and coupled to plural CAM cells, each bit line oriented parallel to rows of the array;

wherein the plurality of bit lines comprise:

a plurality of first bit lines, one first bit line per row of the array, each first bit line shared as a true bit line by the first and second SRAM cells in each CAM cell; and a plurality of second bit lines, one second bit line per row of the array, each second bit line except for a first one of the second bit lines, shared as a complement bit line by the first SRAM cell in one CAM cell and the second SRAM cell in an adjacent CAM cell along the column.

13. The CAM of claim 12, further comprising:
a plurality of match lines, each match line extending across the array and coupled to plural CAM cells, each match line oriented parallel to the columns of the array.

14. The CAM of claim 12, further comprising a plurality of first word lines coupled to the wordline decoder, each first word line extending across the array and coupled to first SRAM cells within plural CAM cells, each first word line oriented parallel to the columns of the array.

15. The CAM of claim 14, further comprising a plurality of second word lines coupled to the wordline decoder, each second word extending across the array and coupled to second SRAM cells within plural CAM cells, each second word line oriented parallel to the columns of the array.

16. The CAM of claim 12, wherein the plurality of bit lines further comprise a plurality of third bit lines, one third bit line per row of the array, each third bit line except for a last one of the third bit lines, shared as a complement bit line by the second SRAM cell in one CAM cell and the first SRAM cell in an adjacent CAM cell along the column.

17. The CAM of claim 16, further comprising, for each row:
a write driver;
a search data driver;
a sense amplifier; and
a MUX circuit, said MUX circuit operable to selectively couple the write driver and sense amplifier to the first, second and third bit lines of each row.

18. A content addressable memory (CAM) cell for a memory array having rows and columns, comprising:
a first SRAM cell;
a second SRAM cell;
a comparator circuit coupled to the first and second SRAM cells;
wherein the first and second SRAM cells having a horizontal topology layout with a longer side edge and a shorter side edge;
a match line coupled to an output of the comparator circuit, said match line oriented in a column direction that is parallel to the shorter side edge of the horizontal topology for the first and second SRAM cells;
a first bit line coupled to true storage nodes of the first and second SRAM cells, said first bit line oriented in a row direction that is both perpendicular to the column direction and parallel to the longer side edge of the horizontal topology layout for the first and second SRAM cells;

a second bit line coupled to a complement storage node of the first SRAM cell, said second bit line also oriented in the row direction and configured to be shared with another CAM cell in an adjacent row; and
  a third bit line coupled to a complement storage node of the second SRAM cell, said third bit line also oriented in the row direction and configured to be shared with yet another CAM cell in an another adjacent row.

19. The CAM cell of claim 18, wherein the second and third bit lines are each positioned along a boundary between adjacent CAM cells in adjacent rows.

20. The CAM cell of claim 19, wherein the first bit line is positioned between the second third bit lines.

21. The CAM cell of claim 19, further comprising a search line coupled to an input of the comparator circuit, said search line also oriented in the row direction and positioned between the second third bit lines.

* * * * *